United States Patent [19]
DeWald, Jr. et al.

[11] Patent Number: 5,928,771
[45] Date of Patent: Jul. 27, 1999

[54] DISORDERED COATING WITH CUBIC BORON NITRIDE DISPERSED THEREIN

[75] Inventors: A. Bruce DeWald, Jr., Hickory, N.C.; Kenneth Lewis Beattie, Lake Ridge, Va.

[73] Assignee: Diamond Black Technologies, Inc., Durham, N.C.

[21] Appl. No.: 08/552,500

[22] Filed: Nov. 9, 1995

Related U.S. Application Data

[63] Continuation of application No. 08/439,681, May 12, 1995, abandoned.

[51] Int. Cl.$^6$ .................................................. C23C 14/06
[52] U.S. Cl. ........................ 428/216; 428/336; 428/698; 428/704; 51/307; 51/309
[58] Field of Search .................................... 428/216, 336, 428/698, 704; 51/295, 307, 309

[56] References Cited

U.S. PATENT DOCUMENTS

| | | |
|---|---|---|
| 4,384,933 | 5/1983 | Takasaki . |
| 4,619,865 | 10/1986 | Keem et al. ............................ 428/698 |
| 4,716,083 | 12/1987 | Eichen et al. ........................... 428/698 |
| 4,735,856 | 4/1988 | Schultz et al. . |
| 5,057,199 | 10/1991 | Lievens et al. . |
| 5,075,130 | 12/1991 | Reeber et al. . |
| 5,270,263 | 12/1993 | Kim et al. . |
| 5,346,601 | 9/1994 | Barada et al. . |
| 5,478,634 | 12/1995 | Setoyama et al. . |
| 5,503,912 | 4/1996 | Setoyama et al. . |
| 5,670,252 | 9/1997 | Makowiecki et al. .................. 428/336 |

FOREIGN PATENT DOCUMENTS

| | | |
|---|---|---|
| 0 504 959 A2 | 9/1992 | European Pat. Off. . |
| 44 07 274 C1 | 3/1995 | Germany . |

OTHER PUBLICATIONS

R.F. Bunshah, "PVD and CVD Coatings," *ASM Handbook® Friction, Lubrication, and Wear Technology,* vol. 18, pp. 840–849 (1992).

R.A. Swady et al., "The reactive sputtering of thin films of TiN at low target voltages," *Vacuum,* vol. 44, No. 3/4, pp. 297–301 (1993).

A. Leyland et al., "Plasma Nitriding in a Low Pressure Triode Discharge to Provede Improvements in Adhesion and Load Support for Wear Resistant Coatings," *Surface Engineering,* vol. 7, No. 3, pp. 207–215 (1991).

J.I. Oñate et al., "Deposition of hydrogenated B–C thin films and their mechanical and chemical characterization," *Surface and Coatings Technology,* 49, pp. 548–553 (1991).

M.G. Fleming et al., "A Comparison of Magnetron Sputtered and Arc Evaporated PVD Thin Films for Wear Applications in Multipoint Cutting Tools," *Journal of Materials Processing Technology,* 32, pp. 481–488 (1992).

P.V. Kola et al., "Magnetron sputtered carbon nitride films," *Surface and Coatings Technology,* 68/69, pp. 188–193 (1994).

Gunter Spur et al., "The Performance of High Speed Steel Indexible Inserts Coated By Physical Vapour Deposition in the Milling of Ductile Materials," *Surface and Coatings Technology,* 43/44, pp. 1074–1085 (1990).

(List continued on next page.)

*Primary Examiner*—Archene Turner
*Attorney, Agent, or Firm*—Alston & Bird LLP

[57] ABSTRACT

A coating of cubic boron nitride dispersed in a matrix of disordered boron and carbon, such as boron carbide, is provided by sputtering. The coating is wear resistant, adherent, lubricous, and suitable as a coating for tools, molds, and wear parts. The coating has first, second, and third regions. The first region is sputtered in an inert atmosphere onto a substrate such as tool steel and is at least one layer of disordered boron and carbon. The inert sputtering atmosphere is gradually replaced with nitrogen to form the second region, which has cubic boron nitride crystals in a gradually increasing concentration dispersed in a matrix of disordered boron and carbon. The third region atop the second region is an outer wear layer that has a substantially uniform concentration throughout of cubic boron nitride dispersed in disordered boron and carbon.

18 Claims, 2 Drawing Sheets

OTHER PUBLICATIONS

E.K. Gol'man et al., "Determination of the optimum discharge parameters in reactive magnetron sputtering of NbN films," *Sov. Tech. Phys. Lett.,* 18(9), p. 584 (Sep. 1992).

Ralf Riedel, "Materials Harder Than Diamond?," *Adv. Mater.,* 4, No. 11, pp. 759–761 (1992).

Patent Abstracts of Japan, vol. 013, No. 590 (P–984), Dec. 26, 1989 and JP, A, 01 251313 (Fuji Electric Co Ltd), Oct. 6, 1989.

H. Lithje et al., "Preparation of Cubic Boron Nitride Films by Use of Electrically Conductive Boron Carbide Targets," *Thin Solid Films,* vol. 257, No. 1, pp. 40–45, Feb. 15, 1995.

DISORDERED COATING WITH CUBIC BORON NITRIDE DISPERSED THEREIN

This application is a continuation of U.S. Ser. No. 08/439,681, which was filed on May 12, 1995 and is entitled DISORDERED COATING WITH CUBIC BORON NITRIDE DISPERSED THEREIN now abandoned.

FIELD OF THE INVENTION

This invention relates to hard substance coatings and more particularly to coatings on surfaces such as tools, wear parts, and molds that are subjected to friction or wear.

BACKGROUND OF THE INVENTION

Hard substance coatings have been applied to tools, molds, and wear parts to improve their surface characteristics and length of useful life. Some such coatings are suitable for decorative purposes. A number of coatings have been developed, one of which is described in U.S. Pat. No. 4,716,083.

U.S. Pat. No. 4,716,083 describes a disordered coating of boron and carbon having the composition $B_xC_{1-x}$ where "B" represents boron, "C" represents carbon, and "x" and "1-x" represent, respectively, the relative amounts based on atomic weight of boron and carbon present in the coating. The boron and carbon coating is disclosed to be amorphous, polycrystalline and lacking long range order, microcrystalline, or a mixture of any combination of these phases. The coating can be applied by sputtering at relatively low temperatures and produces an adherent, hard coating that is lubricous and can be applied in thin layers.

Despite the favorable characteristics of the coating described in U.S. Pat. No. 4,716,083 as applied to wear parts, tools, and mold surfaces, it is desirable to produce coatings having even more enhanced characteristics, such as hardness, lubricity, and adherence. However, harder coatings sometimes fail to have the advantages of the coating of U.S. Pat. No. 4,716,083. For example, harder, diamond-like coatings have been produced ("DLC" coatings), but these typically do not have sufficient adherence for usefulness on a wear part or tool. DLC coatings frequently fail when a tool or wear part is put to use.

SUMMARY OF THE INVENTION

The invention is of a coating of disordered boron and carbon that has cubic boron nitride dispersed therein so as to be adherent to a substrate. The coating can be applied to a substrate at relatively low temperatures by sputtering. The sputtering conditions can be controlled to provide a coating that has enhanced hardness, wear resistance, and lubricity as compared to coatings of disordered boron and carbon alone.

In one embodiment, the invention is of an article comprising a substrate and a coating deposited on the substrate by sputtering. The coating comprises cubic boron nitride dispersed in disordered boron and carbon. The concentration of cubic boron nitride present in the coating is zero at the substrate and increases in a direction proceeding away from the substrate.

In another embodiment, the coating comprises a first region adjacent the substrate that comprises disordered boron and carbon and a second region adjacent the first region that comprises cubic boron nitride dispersed in disordered boron and carbon. The concentration of cubic boron nitride in the second region increases in a direction away from the first region.

In yet another embodiment, the coating includes a third region adjacent the second region that comprises cubic boron nitride dispersed in disordered boron and carbon, usually at a uniform concentration. The cubic boron nitride that is dispersed in disordered boron and carbon has a crystalline structure in which the crystal size ranges from nanocrystalline and lacking long range order to macrocrystalline and having long range order.

The invention also includes a method for applying to a substrate a coating that comprises cubic boron nitride. The method comprises the steps of depositing at least one layer of disordered boron and carbon on a substrate and then depositing at least one layer of cubic boron nitride dispersed in disordered boron and carbon atop the first layer. An example of this method is plasma assisted dc magnetron sputtering from a boron carbide target, although other methods of sputtering are available and the targets can comprise elemental boron and carbon. A source of nitrogen is introduced into the sputtering atmosphere to create cubic boron nitride from a target that contains boron.

The second layer, which comprises cubic boron nitride, is applied atop the first layer of disordered boron and carbon and is characterized by having either no cubic boron nitride adjacent the layer of disordered boron and carbon or a low concentration of cubic boron nitride there. The concentration of cubic boron nitride in the second layer increases in a direction proceeding away from the first layer. Nitrogen is gradually introduced into the inert atmosphere, usually at constant pressure, after the disordered boron and carbon coating is produced. Sputtering is continued while the nitrogen is introduced and the inert atmosphere is withdrawn. The inert atmosphere can be completely replaced with nitrogen, although some inert atmosphere typically is retained, up to about 20 percent of the total pressure. A layer of cubic boron nitride dispersed in disordered boron and carbon can then be deposited, if desired, to a thickness of from about 0.01 to 6 microns or more.

Thus, the invention provides a coating that comprises cubic boron nitride dispersed in disordered boron and carbon, such as amorphous boron carbide, and that can be sputter deposited so as to be adherent and to have enhanced characteristics over previous coatings. The invention also provides a plasma assisted method for applying the coating by sputtering in which nitrogen is introduced to the plasma. Sputter deposition parameters can be controlled to produce a coating having a dry coefficient of static friction at least as low as 0.08.

BRIEF DESCRIPTION OF THE DRAWINGS

Some of the features and advantages of the invention have been stated. Other advantages will become apparent as the description of the invention proceeds, taking in conjunction the accompanying drawings, in which.

DETAILED DESCRIPTION OF THE PREFERRED EMBODIMENTS

The invention will now be described more fully with reference to the accompanying drawings, which represent a preferred embodiment of the invention. In the preferred embodiment, the invention includes an article having a substrate and a coating applied thereto having an initial interfacial region, a transition region, and an outer region, all of which contain disordered boron and carbon. The transition and outer regions include cubic boron nitride dispersed in disordered boron and carbon.

The interfacial region is of disordered boron and carbon is applied to the substrate by sputtering in an inert atmosphere. The transition region is a relatively thin region of cubic boron nitride crystals in a boron and carbon matrix applied to the interfacial region by sputtering in a nitrogen assisted plasma. The concentration of boron nitride increases in a direction away from the interfacial region as the percentage of nitrogen in the plasma increases. The outer region is applied to the transition region by sputtering in a nitrogen assisted plasma and is comprised of cubic boron nitride dispersed at a uniform concentration in a boron and carbon matrix. The concentration of cubic boron nitride is the same as that at the outermost portion of the transition region to match thermal expansion and other physical properties and to promote adherence and wear resistance.

Figure 1:
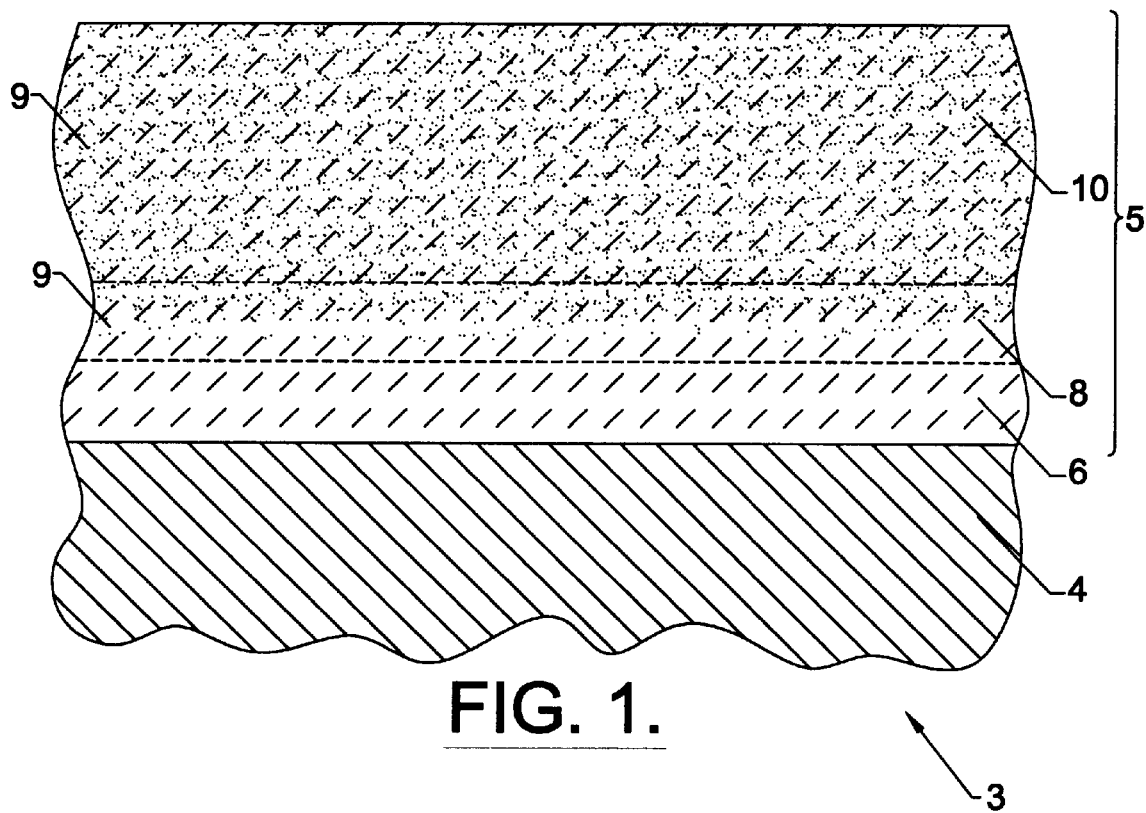
FIG. 1 represents in sectional view a coating applied to a substrate in accordance with the invention.

An article of a preferred embodiment of the invention is represented generally in section in FIG. 1 by the numeral 3. The article includes a substrate 4 that has a coating 5 of the invention applied thereto comprising interfacial region 6, transition region 8 with cubic boron nitride crystals 9, and outer region 10 with cubic boron nitride crystals 9.

The term "substrate" is used to mean that portion of a tool or other object exclusive of a coating or coatings in accordance with the invention. The invention is suitable for coating precisely dimensioned substrates. The invention is particularly useful for coating substrates including precision tools made of various materials and wear parts and molds made from steel, aluminum, chrome, nickel, tungsten carbide, cemented carbides, graphite, glass, synthetic polymers, and other substances that can be adversely affected by elevated temperature. The processing temperatures used in sputtering do not normally degrade the properties of these substances. The coatings of the invention can be formed by sputtering at relatively low temperatures to avoid significant changes in the properties of the substrate material, such as dimensions and hardness. Sputtering can take place at relatively low substrate temperatures, generally about 200° C. or less, usually at about 100° C. to 150° C., or even less. Sputtering at low substrate temperatures also promotes formation of the coatings in a disordered state.

It is important to provide an atomically clean surface on that portion of the tool or other substrate that is to be coated before subjecting the substrate to coating. Providing an atomically clean surface facilitates the formation of a uniform coating that is adherent to the substrate surface. Foreign material on the substrate surface, including out-gassing from the substrate surface, can cause premature failure of the coating or a lack of adherence.

There are several methods known to the skilled artisan for providing an atomically clean surface for sputtering and any such method may be used, provided the surface is adequately cleaned. In accordance with one method for providing an atomically clean substrate surface, as is shown in U.S. Pat. No. 4,716,083, the substrate is degreased with a chlorinated hydrocarbon degreaser. Thereafter, the substrate is rinsed in methanol and subjected to either plasma or dry chemical etching. A fluorinated carrier gas is preferred for plasma etching. The carrier gas decomposes and provides fluorine, which cleans the substrate surface. The final step for providing an atomically clean surface for the coating is etching by sputtering in an argon or other suitable inert plasma.

Alternatively, the substrate can be cleaned initially using commercially available aqueous cleaners instead of organic cleaning agents. Aqueous cleaners typically are used in connection with a variety of oxidation inhibitors to prevent oxidation of exposed metal substrate surfaces prior to deposition of the coating. As with organic cleaners, an etching step in argon or other suitable inert plasma is the final step for achieving an atomically clean surface.

The coating includes an interfacial or first region 6 of disordered boron and carbon. Region 6 is at least one layer and serves as an interfacial region between the substrate and the regions of the coating that include cubic boron nitride. Cubic boron nitride does not typically have sufficient adherence for depositing directly on a substrate that is used in wear or mold release applications. The internal stresses in cubic boron nitride usually differ from the substrate to the extent that cubic boron nitride deposited directly upon a substrate will fail when the substrate is put to use. However, practice of the invention described herein substantially precludes large differences in the physical properties of the adjacent layers of the coating and between the substrate and layers deposited directly upon the substrate.

It should be understood that the disordered boron and carbon coating of regions 6, 8, and 10 can comprise elemental boron and carbon, nonstoichiometric boron carbide, and/or stoichiometric boron carbide, or a mixture of any or all of these. Typically, all these species are present in a matrix coating that is prepared from a stoichiometric boron carbide target.

The boron and carbon composition of the disordered coating of region 6 can be represented by the formula $B_xC_{1-x}$, where "B" represents boron, "C" represents carbon, and "x" and "1–x" represent, respectively, the relative amounts of boron and carbon present by atomic weight in the coating, as boron carbide and as elemental boron and carbon. The atomic weight of boron is 10.811 and the atomic weight of carbon is 12.01115.

The amount of boron present in the coating as defined by "x" can be from about 0.1 to about 0.9. A disordered coating of boron and carbon on either side of this range is also included within the scope of this invention. Normally, "x" will be from about 0.6 to 0.9. For stoichiometric boron carbide coating, which is represented by the chemical formula $B_4C$, "x" is approximately 0.78. For the boron carbide compound $B_{13}C_2$, x is approximately 0.85, and this compound is intended to be included.

Region 6 typically should be disordered, which is to say that the coating of region 6 is deposited in a form that can be characterized as amorphous, polycrystalline and lacking long range order, nanocrystalline, or microcrystalline, or a mixture of any combination of these phases. Nanocrystalline describes crystals on the order of 100's of Angstroms and microcrystalline describes crystals on the order of submicron size to microns.

Disordered material lacks extended lattice planes through which fractures can propagate and in general can withstand relatively high deformation forces without fracture. Such materials typically are less susceptible to adverse chemical attack, such as corrosion and oxidation, than are single phase crystalline materials. The stoichiometry of the coating can be varied to achieve desired characteristics while avoiding the formation of extended lattice planes that could adversely effect the adherence, wear resistance, or other properties of the coating.

The coating of region 6 typically is applied by sputtering. DC magnetron sputtering with a bias voltage has proved a useful technique. Ion sputtering, unbalanced magnetron sputtering, and rf sputtering are also techniques that can be used to apply the coating of region 6, although not necessarily with equivalent results. It is intended to include dc sputtering, dc magnetron sputtering, ion sputtering, unbalanced magnetron sputtering, and rf sputtering within the general term sputtering. The procedures taught in U.S. Pat. No. 4,716,083 generally are suitable for application of disordered coatings of boron and carbon and are incorporated herein by reference for depositing the disordered boron and carbon coating of region 6.

The coating of region 6 can be sputtered from a target that comprises a substantially pure stoichiometric or near stoichiometric crystalline powder of pressed and scintered boron carbide. However, nonstoichiometric boron carbide coatings are also contemplated. It should also be possible to produce coatings having the benefits of the invention by sputtering from nonstoichiometric boron carbide targets, from separate targets of boron and carbon in a plasma that overlaps each target, and from boron enriched boron carbide or graphite targets. For example, it is contemplated to use a graphite target enriched in boron in combination with targets that comprise boron and carbon. The boron rich targets should ensure sufficient boron to produce the matrix in the transition and outer regions of the coating where the targets comprising boron and carbon can become relatively low in boron.

The preferred sputtering conditions of temperature, pressure, and bias voltage depend in part on the surface geometry and type of internal microstructure desired. Normally, it is desirable for the surface of the coating to be smooth, especially for many wear related applications. The internal microstructure of the disordered coating may be columnar or noncolumnar. For some applications, a columnar coating can be desirable. When it is desired to produce a columnar microstructure, any type of sputtering technique known in the art to produce a columnar microstructure can be utilized. One technique for producing a columnar microstructure applies sufficient bias voltage to the substrate to cause formation of the columnar microstructure.

Bias sputtering is the process of maintaining a negative bias voltage on the substrate during deposition of the coating. By applying a bias voltage to the substrate, the density, purity, adhesion, and internal stress of the coating can be controlled. Typically, appropriate application of a bias voltage tends to increase the density, purity, and adhesion of the coating, and to decrease the internal stress of the coating. Control of the bias voltage, as discussed below, in conjunction with substrate temperature, also tends to determine the size of cubic boron nitride crystals that are formed in subsequent regions.

The bias voltage applied to the substrate during sputtering can be varied in a desired sequence. The preferred bias sequencing depends on the substrate geometry and the desired microstructure of the coating. The interfacial boron carbide layer of region 6 typically is applied with a relatively low bias voltage of, for example, about −100 to −300 volts to ensure complete coverage. However, the coating of region 6 can be successfully applied using much higher bias voltages, such as, for example, from about −1000 to −2500 volts. The bias voltage can be gradually increased by ramping up the voltage or can be increased step wise. Conversely, the bias voltage can be gradually decreased by ramping down the voltage or can be decreased step wise.

Plasma pressure typically is maintained in a vacuum condition for sputtering. For example, a pressure of from 2 to 10 mtorr should be useful, depending upon the target to substrate mean free path distance. The pressure may need to be adjusted as is known to the skilled artisan depending upon the mean free path target to substrate distance.

The thickness of region 6 the coating can be varied over a relatively wide range. For example, region 6 can be grown from a single thin layer of 0.01 microns to multiple layers as much as 6 microns thick or more. Thicker regions can be expected to show beneficial thermal properties. Typically, region 6 is from 0.01 to 3 microns thick. More typically, region 6 is from 0.05 to 0.25 microns thick.

After region 6 of the coating has been deposited by sputtering in an inert gas, such as argon, then a transition region 8 can be applied to the layer of disordered boron and carbon to provide a transition between a layer comprising disordered boron and carbon and one comprising cubic boron nitride dispersed in a matrix of disordered boron and carbon. One way of accomplishing the production of cubic boron nitride for incorporation into the coating is to gradually replace the argon or other inert plasma gas with nitrogen. A nitrogen plasma is reactive under the conditions described and sputtering in a reactive plasma is sometimes referred to as "plasma assisted" sputter deposition.

It has been determined to be useful to maintain the vacuum chamber gas pressure at substantially the same level or greater than the inert gas replaced with nitrogen. As nitrogen is introduced to the plasma, it reacts with the boron atoms at the surface of the substrate to form cubic boron nitride. The coating comprising boron and carbon continues to be laid down. Cubic boron nitride is incorporated into the disordered boron and carbon coating matrix as it is deposited.

As shown in FIG. 1, cubic boron nitride crystals begin to be introduced into the coating of region 8 at a low concentration adjacent to region 6 as nitrogen gas is introduced into the coating chamber and argon is removed. The concentration of cubic boron nitride crystals increases away from zero at the region 6 as nitrogen replaces the argon. Region 8 can have cubic boron nitride crystals present in a concentration that proceeds upward from zero percent to a few percent or higher, generally from 20 to less than 50 percent by weight and usually not more than about 30 to 35 percent.

The concentration of cubic boron nitride crystals in region 8 can by controlled by varying the amount of nitrogen or boron available for reaction in the plasma or by manipulating the sputtering conditions of temperature and bias voltage. However, it should be noted that, for a given target composition, less boron is available for formation of boron carbide as boron nitride is formed, which results in a boron carbide matrix whose stoichiometry is not constant and is usually nonstoichiometric even if the target is stoichiometric.

Nitrogen gradually replaces the inert sputtering atmosphere when region 8 is deposited, which causes the concentration of cubic boron nitride in the coating to increase in a direction away from the substrate so as to reach a maximum in dependence upon the proportion of nitrogen in the sputtering atmosphere, all other things being equal. All of the inert atmosphere can ultimately be replaced with nitrogen, if desired. Usually, however, not all of the inert atmosphere is replaced. About 10 to 20 percent by partial pressure of the inert sputtering atmosphere can be retained. While not wishing to be bound by theory, it is believed that retaining a small concentration of inert gas in the sputtering atmosphere assists in the formation of the coating by continuously sputter cleaning the surface of the substrate upon which the coating is deposited.

The thickness of region 8 can be varied over a wide range, depending upon whether region 10 is to be applied. Region 8 should be relatively thin to ensure integrity when used as a transition region to avoid the risk of coating failure. Region 8 typically will be from about 0.01 to 1 micron thick when used as a transition region. When region 10 is not applied, then region 8 can conveniently be deposited to the same thickness as region 6 of from 0.01 to 3 microns thick, and more typically from about 0.05 to 0.25 microns thick. However, region 8 can be deposited to a thickness of up to about 6 microns thick, if desired.

Region 8 is typically deposited at a low negative bias voltage of from about −50 to −500 volts. Ranges of from about −175 to −325 volts and from about −100 to −300 volts are useful. It is important to control the bias voltage so that formation of cubic boron nitride is more likely. Other forms of boron nitride are not hard and may not provide a useful coating for wear parts. Small amounts of non-cubic boron nitride can be incorporated into the coating without diminishing the desired characteristics of the coating. Nevertheless, it is desirable to control the deposition conditions, and in particular, the negative bias voltage and temperature, to maintain the cubic boron nitride as the predominant form of boron nitride that is produced.

Transition region 8 as shown in FIG. 1 provides on its inner surface a coating that has physical properties that are similar to the coating of region 6 and provides for excellent adherence to the coating of region 6 under a variety of conditions and in actual use. Cubic boron nitride is introduced gradually into the composition of transition region 8 so that the transition region has a gradual change and not an abrupt change of its physical properties. The outer layer of transition region 8 shown in FIG. 1 has physical properties that are similar to those of the optional outer region 10 of the coating.

Cubic boron nitride normally is present in region 10 in a concentration of from about 20 to less than 50 percent by weight. However, at higher concentrations, the coating can be subject to failure and so, typically, the maximum concentration of cubic boron nitride is generally about 30 to 35 percent by weight of the coating. Useful coatings are also contemplated having much less cubic boron nitride present, down to 1 or a few percent, although typically the coating of region 10 will have a concentration of cubic boron nitride that is the same as the maximum concentration of region 8 at the outermost portion of region 8 to provide the best match of physical properties between the two regions.

The coating of region 10, if present, can be from about 0.01 to 6 microns in thickness. Thicker coatings typically are desirable in wear applications. However, coatings having a thickness of each region in the range of from about 0.01 to 0.5 microns thick have been determined to be useful in wear applications. For most wear applications, the coating of region 10 should be from about 0.75 to 2 microns thick. The coating can be applied as a single layer or as multiple layers.

It should be recognized that transition region 8 could be continued to the desired thickness for the coating and achieve results similar to a coating having separate regions 8 and 10. Typically, however, for wear applications, it is desirable to reduce the substrate bias voltage after the inert plasma has been replaced from 80 to 100 percent with reactive nitrogen gas. The substrate bias voltage typically will be reduced below that used to deposit the transition region 8 and normally is adjusted to less than about −200 volts. A change in voltage of 25 volts is significant when conditions are otherwise at an optimum. Substrate bias voltage can be reduced to as low as −25 volts. Typically, substrate bias voltage will be from about −50 to −200 volts, which bias favors the formation of cubic boron nitride. A range of from −60 to −150 volts is useful.

Cubic boron nitride can be deposited at temperatures ranging from about 50° C. to 400° C. and above. Coatings of the invention have been produced at 70° C. Above about 400° C., many ferrous and nonferrous substrate materials, including tool steels, could be adversely affected. Substrate temperature is typically increased over that used for application of regions 6 and 8, from about 100° C. to 200° C. or less, for application of region 10. The temperature can be increased to provide somewhat more favorable conditions for deposition of cubic boron nitride. Generally, the quality of deposition of the layers is sensitive to changes in temperature of as little as 25° C. when conditions are otherwise optimum.

It should be noted that the substrate surface temperature typically is measured by use of thermo couples, which do not necessarily accurately reflect the actual temperature of the substrate, but only provide an indication thereof. Care should be taken not to damage heat sensitive substrate materials.

The coating of cubic boron nitride dispersed in disordered boron and carbon of regions 8 and 10 is a two phase material that consists of crystals of boron nitride interspersed in a boron and carbon matrix. The crystals can be present in a size of from nanocrystals to macrocrystals. Nanocrystals are very short order crystals on the order of 100's of Angstroms, and can be defined as amorphous or polycrystalline and lacking long range order. When macrocrystalline boron nitride crystals are incorporated into the coating, these crystals are defined as having sizes on the order of several microns to tens of microns in size.

Figure 2:
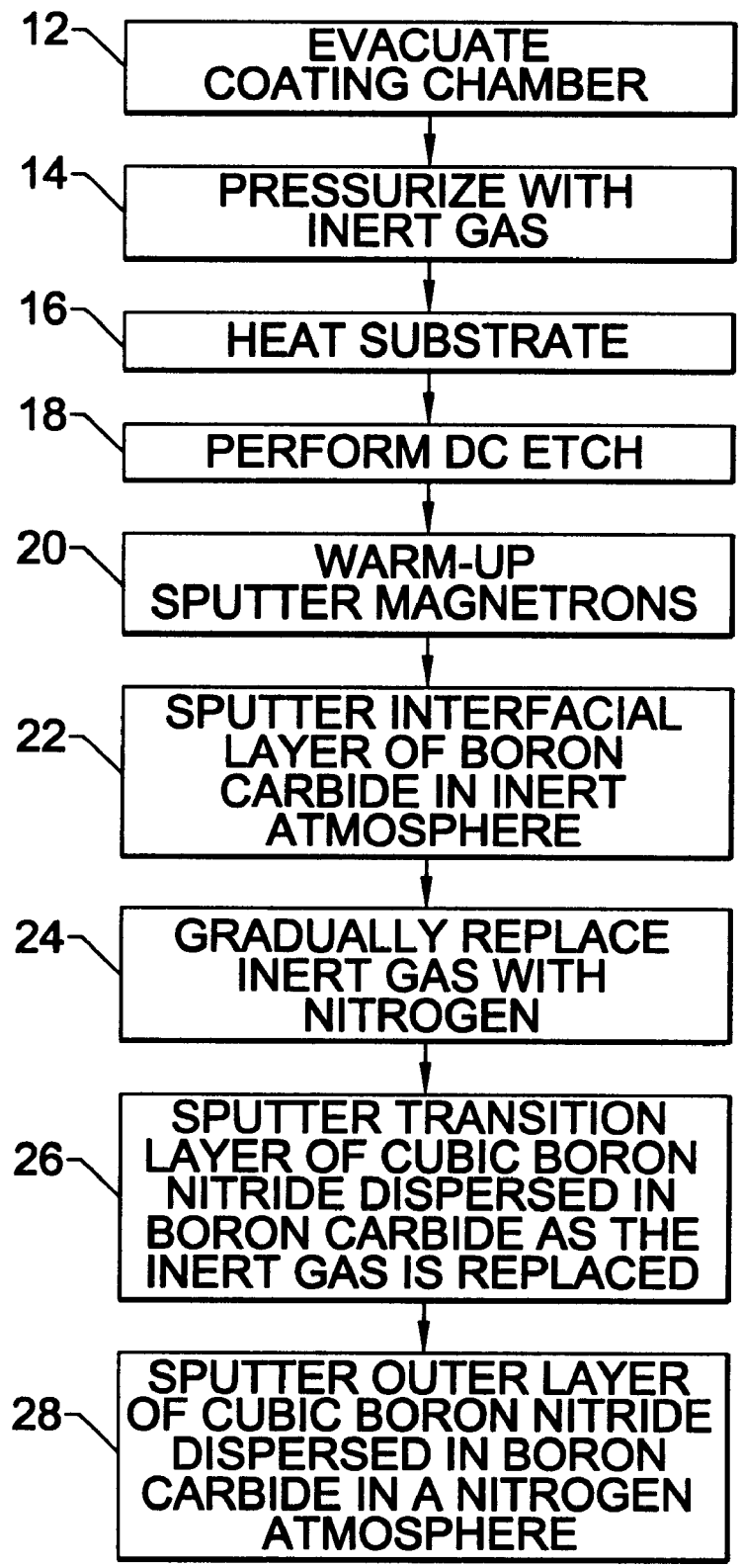
FIG. 2 represents generally the method steps by which the coating of the invention is deposited on the substrate.

Turning now to FIG. 2, FIG. 2 describes generally the steps by which the coating of the invention is applied to a substrate. Generally, the substrates are cleaned before entering the vacuum coating chamber by using organic solvents or a combination of aqueous solvents and rust inhibitors. The dry substrates are then placed in the vacuum coating chamber. The chamber is evacuated in accordance with step 12. The substrates are subjected to sputter etching in an inert atmosphere such as argon to atomically clean the substrates. The substrate is heated and the vacuum chamber is pressurized with the inert gas to a pressure of from about 25 to 100 mtorr in accordance with steps 14 and 16. A high bias voltage is applied to the substrate. Typically, a bias voltage of from about −1500 to −2500 volts should be sufficient to perform the sputter etching as in step 18. It should be noted that voltages of from about −500 to −1500 volts, which are more typical for sputter etching, should also be useful.

It is desirable to perform a second DC etch step at working pressure, which is typically around about 5 mtorr. The first etch scrubs the surface of impurities and the second etch removes oxides that may be present on the surface of the substrate. The substrate bias can also be adjusted, if desired, to about −1500 volts, −1000 volts, or even −750 volts. During the etching step, the sputter magnetrons should be warmed up and prepared for depositing the coating as shown in step 20 without delay between the etching and depositing steps.

After the dc etch is completed, the substrate is atomically cleaned, and the sputter magnetrons are warmed up, then the interfacial region 6 of disordered boron and carbon, FIG. 1, can be applied to the substrate as shown in step 22. The embodiment of FIG. 2 is shown with a boron carbide target.

Following sputter deposition of the disordered boron carbide region, then an additional region is deposited in which the inert sputtering gas is gradually replaced with nitrogen, as in steps 24 and 26. This transition region 8, FIG. 1, is sputter deposited with cubic boron nitride dispersed in boron carbide as the inert gas is replaced. The concentration of cubic boron nitride in the disordered boron and carbon coating gradually increases away from the first region 6.

If desired, an outer region 10 of cubic boron nitride crystals 9 dispersed in boron carbide, FIG. 1, is then produced in a sputtering atmosphere in which the inert gas has been replaced with nitrogen as shown in step 28.

The coating can be homogenous or heterogenous in composition, depending on the deposition parameters chosen. Larger cubic boron nitride crystals tend to produce somewhat harder coatings that appear to be heterogenous.

A second region 8 atop region 6 includes cubic boron nitride crystals 9 dispersed in disordered boron carbide. The concentration of cubic boron nitride crystals in the second region increases in a direction away from the substrate. A third region 10, which is optional, is illustrated atop region 8 and includes cubic boron nitride crystals 9 dispersed in disordered boron carbide at a uniform concentration. The concentration of cubic boron nitride crystals in the coating at region 10 usually will be the same as the maximum concentration at the surface of region 8.

The coating of the invention generally shows a hardness greater than sputter deposited boron carbide coatings that do not contain cubic boron nitride. Cubic boron nitride is one of the hardest substances known and has a micro hardness of reported to be approximately 4700 kp/mm$^2$. By comparison, boron carbide typically has a micro hardness reported to be about 2940 kp/mm$^2$. Sputter deposited coatings of boron carbide typically have hardness values ranging from about 1500 to greater than 4000 kp/mm$^2$, depending upon the characteristics of the desired application. The hardness of the coating regions as disclosed herein comprising cubic boron nitride dispersed in a boron carbide matrix usually is increased compared to boron carbide alone. The boron carbide coating can be improved with only a small amount of cubic boron nitride present in the coating.

The coefficient of static friction of the coatings of the invention is low, indicating great lubricity, and typically is less than or equal to from about 0.15 to 0.2. Coatings can also be produced with a coefficient of static friction of less than about 0.1. The coating of Example 1, shown below, has a coefficient of static friction of about 0.08. The coating of Example 2 has a coefficient of static friction of 0.12.

The following examples are representative of the invention.

EXAMPLE 1

A coating in accordance with the invention was dc magnetron sputtered utilizing a target that comprised a highly pure, crystalline, pressed and scintered B$_4$C powder. The substrate surface was heated to a temperature of 100° C. prior to the dc etch. The vacuum chamber was then backfilled with argon gas to a pressure of 50 mtorr. The dc etch was conducted at 50 mtorr with a −2000 volts dc substrate bias. The dc etch was continued by reducing the argon pressure to 5 mtorr and then maintaining a −1500 volts dc substrate bias.

During the second portion of the etching step, the sputter magnetrons were warmed up. When the sputter magnetrons were warm and the dc etch was completed, an interfacial layer of B$_4$C was deposited using a −250 volts dc substrate bias to a thickness of from 0.05 to 0.20 microns. Thereafter, a transition layer was deposited at −250 volts dc substrate bias to the same thickness as the initial interfacial layer. However, the argon working gas was gradually replaced with a nitrogen working gas. This transition region consisted of a continuum of graded "layers" first consisting of B$_4$C and subsequently becoming more and more enriched with a cubic boron nitride phase. The vacuum chamber gas pressure was maintained at 5 mtorr throughout the entire gas transition. Thus, the final nitrogen working gas pressure for the sputter deposition of cubic boron nitride embedded in a matrix of disordered boron and carbon was 5 mtorr.

Upon completing the gas transition, the substrate bias voltage was reduced to −150 volts dc and the heater power and sputter cathode power were altered to achieve a substrate surface temperature of about 125 to 175° C. Using these parameters, 0.75 to 2 microns of cubic boron nitride dispersed in boron and carbon was deposited.

It should be noted that it is unlikely that stoichiometric boron carbide, B$_4$C, is deposited after nitrogen gas is introduced into the atmosphere in the sputtering chamber. Some of the boron present in the boron carbide target reacts with the nitrogen to produce the cubic boron nitride.

The coefficient of friction of this coating was approximately 0.08 and the outer coating clearly presented two phases comprising cubic boron nitride crystals in a size of from nanocrystals to macrocrystals dispersed in an amorphous boron and carbon matrix. The adhesion scratch test value for this coated article was from 4.0 to 5.0 kg on a substrate of stainless steel #304. Abrasion resistance was defined by observing buffing on the outer coating as applied to the stainless steel #304 substrate. The coating was exposed to a 50 micron glass bead test at 40 psi for 60 seconds without adverse effect.

EXAMPLE 2

Example 2 was conducted under similar conditions. However, an interfacial boron carbide layer was deposited at a higher substrate bias voltage of −1500 volts dc. A second interfacial layer of boron carbide was then deposited at a lower substrate bias voltage of −250 volts dc. These first and second interfacial layers were deposited to a total thickness of from 0.05 to 0.2 microns. Thereafter, a transition layer was deposited similar to that of Example 1 in which nitrogen gradually replaces argon as the working gas of the sputtering chamber. The layer of disordered boron and carbon becomes gradually enriched with a cubic boron nitride phase. However, in this example, the chamber gas pressure was decreased to 4.0 mtorr linearly during the gas transition. Thus, the final working gas pressure for the deposition of cubic boron nitride was 4.0 mtorr.

In contrast to Example 1, a substrate bias voltage of only −60 volts dc was employed to deposit an outer layer of cubic boron nitride dispersed in disordered boron and carbon.

The coefficient of friction of the coating of Example 2 was 0.12 and the apparent hardness of the coating was somewhat lower than with respect to Example 1, although still superior to other coatings. The smaller crystals incorporated in the boron and carbon matrix are thought to be due to the low voltage of −60 volts dc used to deposit this coating. However, this lower bias coating had good adherence to the substrate, as did that of Example 1, indicating that delamination of the coating is gradual, rather than catastrophic, as with many hard crystalline materials, such as many diamond-like coatings ("DLCs").

Abrasion resistance was defined by the observation of buffing even after exposure to a 50 micron glass bead test at 40 psi for 30 seconds.

It is to be understood that the coatings of the present invention are not limited to wear applications involving tools or decorative uses. The invention is useful on surfaces that may not be subjected to wear, including, for example, and not as a limitation on the invention, bearings, engine parts, fittings, molds, and other devices.

The foregoing description is to be considered illustrative rather than restrictive of the invention. While this invention has been described in relation to its specific embodiments, it is to be understood the various modifications thereof will be apparent to those of ordinary skill in the art upon reading this specification and it is intended to cover all such modifications that come within the meaning and range of equivalents of the appended claims.

What is claimed is:

1. An article comprising a substrate and a coating deposited on said substrate, said coating comprising a first region adjacent said substrate comprising disordered boron and carbon and having a thickness of from about 0.01 to 6 microns and a second region adjacent said first region comprising cubic boron nitride dispersed in disordered boron and carbon and in which the concentration of cubic boron nitride in said coating gradually increases from zero in a direction away from said first region to less than about 50 percent by weight, said second region having a thickness of from about 0.01 to 6 microns.

2. The article of claim 1 further comprising a third region adjacent said second region and separated by said second region from said first region and comprising cubic boron nitride dispersed in disordered boron and carbon at a substantially uniform concentration of from about 1 to 50 percent by weight, the third region having a thickness of from about 0.01 to 6 microns.

3. The article of claim 2, wherein the concentration of cubic boron nitride in said second region increases to substantially the same concentration as that of the third region adjacent the third region.

4. The article of claim 2, wherein said cubic boron nitride is present in said third layer at a concentration of from about 20 to 35 percent by weight.

5. The article of claim 2, wherein said first and second regions each have a thickness of from about 0.01 to 3 microns, and wherein said third region has a thickness of from about 0.75 to 2 microns.

6. The article of claim 2 wherein said first and second regions each have a thickness of from about 0.05 to 0.25 microns, and wherein said third region has a thickness of from about 0.75 to 2 microns.

7. The article of claim 1 wherein said cubic boron nitride has a crystalline structure in which the crystal size is from nanocrystalline and lacking long range order to macrocrystalline and having long range order.

8. The article of claim 1 wherein said disordered boron and carbon comprises species selected from the group consisting of elemental boron, elemental carbon, nonstoichiometric boron carbide, and stoichiometric boron carbide.

9. The article of claim 1 wherein said coating has a coefficient of static friction of less than about 0.15.

10. The article of claim 1 wherein said coating has a coefficient of static friction of less than about 0.1.

11. The article of claim 1 wherein said coating has a coefficient of static friction of about 0.08.

12. The article of claim 1 wherein said coating is applied by plasma assisted dc magnetron sputtering in which nitrogen is used as a reactive gas for the formation of cubic boron nitride.

13. The article of claim 1 wherein said disordered boron and carbon has the composition $B_xC_{1-x}$, wherein B represents boron, C represents carbon, and x is from about 0.1 to 0.9, and wherein x and 1−x represent the relative amounts of boron and carbon respectively, present in the coating as elemental boron, elemental carbon, nonstoichoimetric boron carbide, and stoichiometric boron carbide.

14. The article of claim 1 wherein said disordered boron and carbon of said first region comprises stoichiometric $B_4C$.

15. The article of claim 1 wherein said disordered boron and carbon of said first region comprises $B_{13}C_2$.

16. An article comprising a substrate selected from the group consisting of tools, molds, and wear parts and a coating deposited on said substrate, said coating comprising a first region adjacent said substrate comprising disordered boron and carbon and having a thickness of from about 0.05 to 0.25 microns, a second region adjacent said first region comprising cubic boron nitride dispersed in disordered boron and carbon and in which the concentration of cubic boron nitride in said coating gradually increases from zero in a direction away from said first region to about 20 to 35 percent by weight, said second region having a thickness of from about 0.05 to 0.25 microns, and a third region adjacent the second region and separated by said second region from said first region and comprising cubic boron nitride dispersed in disordered boron and carbon at a substantially uniform concentration of from about 20 to 35 percent by weight, the third region having a thickness of from about 0.75 to 2 microns, and wherein the concentration of cubic boron nitride in said second region increases to substantially the same concentration as that of the third region adjacent the second region.

17. The article of claim 16, wherein said cubic boron nitride has a crystalline structure in which the crystal size is from nanocrystalline and lacking long range order to macrocrystalline and having long range order.

18. The article of claim 16, wherein said disordered boron and carbon comprises species selected from the group consisting of elemental boron, elemental carbon, nonstoichiometric boron carbide, and stoichiometric boron carbide.

* * * * *